United States Patent [19]
Lee

[11] Patent Number: 5,516,718
[45] Date of Patent: May 14, 1996

[54] METHOD OF MAKING BI-CMOS INTEGRATED CIRCUIT HAVING A POLYSILICON EMITTER

[75] Inventor: Steven S. Lee, Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 331,235

[22] Filed: Oct. 25, 1994

Related U.S. Application Data

[63] Continuation of Ser. No. 987,916, Dec. 7, 1992, abandoned.

[51] Int. Cl.$^6$ .............................................. H01L 21/8249
[52] U.S. Cl. ............. 437/59; 148/DIG. 9; 148/DIG. 124
[58] Field of Search .................. 437/28, 59; 148/DIG. 9, 148/DIG. 10, DIG. 11, DIG. 109, DIG. 123, DIG. 124

[56] References Cited

U.S. PATENT DOCUMENTS

| | | | |
|---|---|---|---|
| 4,800,171 | 1/1989 | Iranmanesh et al. | 437/31 |
| 4,818,720 | 4/1989 | Iwasaki | 437/59 |
| 4,868,135 | 9/1989 | Ogura et al. | 437/34 |
| 4,897,703 | 1/1990 | Spratt et al. | 357/34 |
| 4,929,570 | 5/1990 | Howell | 437/89 |
| 4,960,726 | 10/1990 | Lechaton et al. | 437/59 |
| 4,965,216 | 10/1990 | Scovell et al. | 148/DIG. 124 |
| 5,001,081 | 3/1991 | Tuntasood et al. | 148/DIG. 9 |
| 5,006,476 | 4/1991 | De Jong et al. | 148/DIG. 9 |
| 5,047,357 | 9/1991 | Eklund | 148/DIG. 124 |

OTHER PUBLICATIONS

Wolf, S., "Silicon Processing for the VLSI Era", vol. 2, p. 65, 1990.
Solid–State Technology—BiCMOS Processing, pp. 71–76, Jun. 1992 Havemann & Eklund—Texas Instruments, Inc.
"Process Integration Issues For Submicron BiCMOS Technology" Solid–State Technology—BiCMOS Processing, pp. 31–34, Aug. 1992 Lage.
"BiCMOS Memories: Increasing Speed While Minimizing Process Complexity" IEEE Journal of Solid–State Circuits, vol. 23, No. 1, pp. 5–11, Feb. 1988, Kubo, et al.
"Perspective on BiCMOS VLSI's".
IEEE Transactions On Electron Devices vol. ED-34 No. 6, pp. 1304–1310 Ikeda, et al., Jun. 1987.
Odaka, Ogiue "High–Speed BiCMOS Technology With A Buried Twin Well Structure".

*Primary Examiner*—Chandra Chaudhari
*Attorney, Agent, or Firm*—Wayne P. Bailey; Douglas Foote

[57] ABSTRACT

The invention concerns a BI-CMOS process, in which Field-Effect Transistors (FETs) and Bipolar Junction Transistors (BJTs) are manufactured on a common substrate. In several processing steps, FET structures are formed simultaneously with BJT structures. For example, in one step, polysilicon gate electrodes for the FETs and polysilicon emitters for the BJTs are formed simultaneously. In another aspect of the invention, a polysilicon layer is used to reduce channeling which would otherwise occur during an implant step.

8 Claims, 17 Drawing Sheets

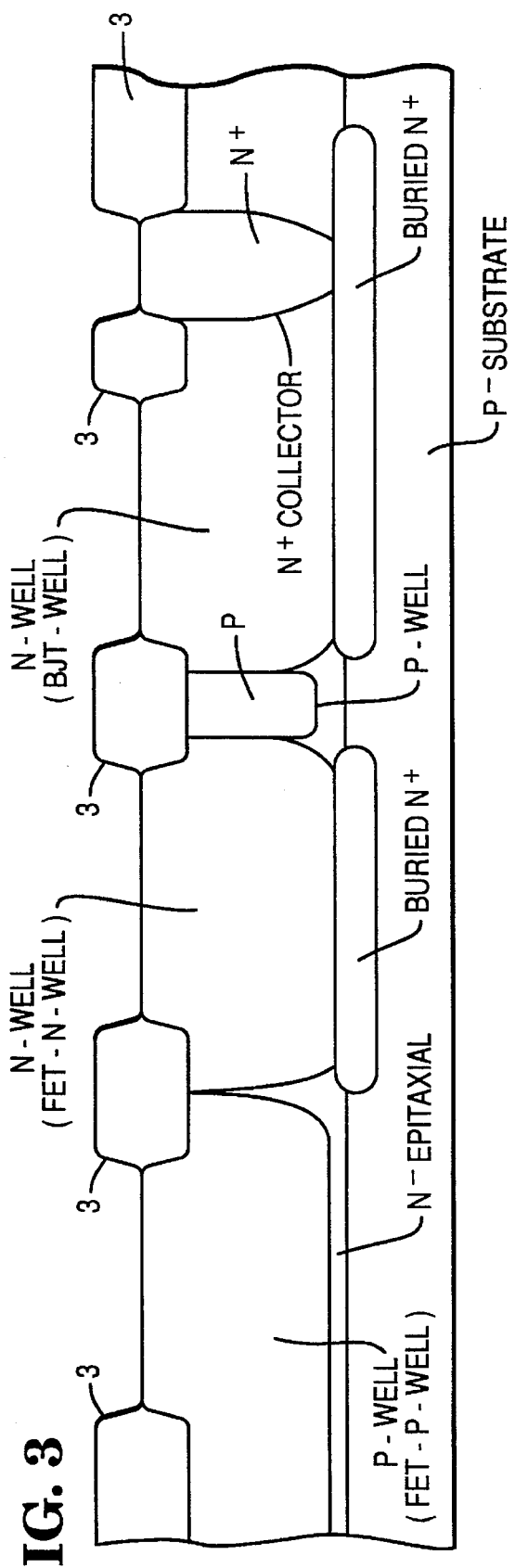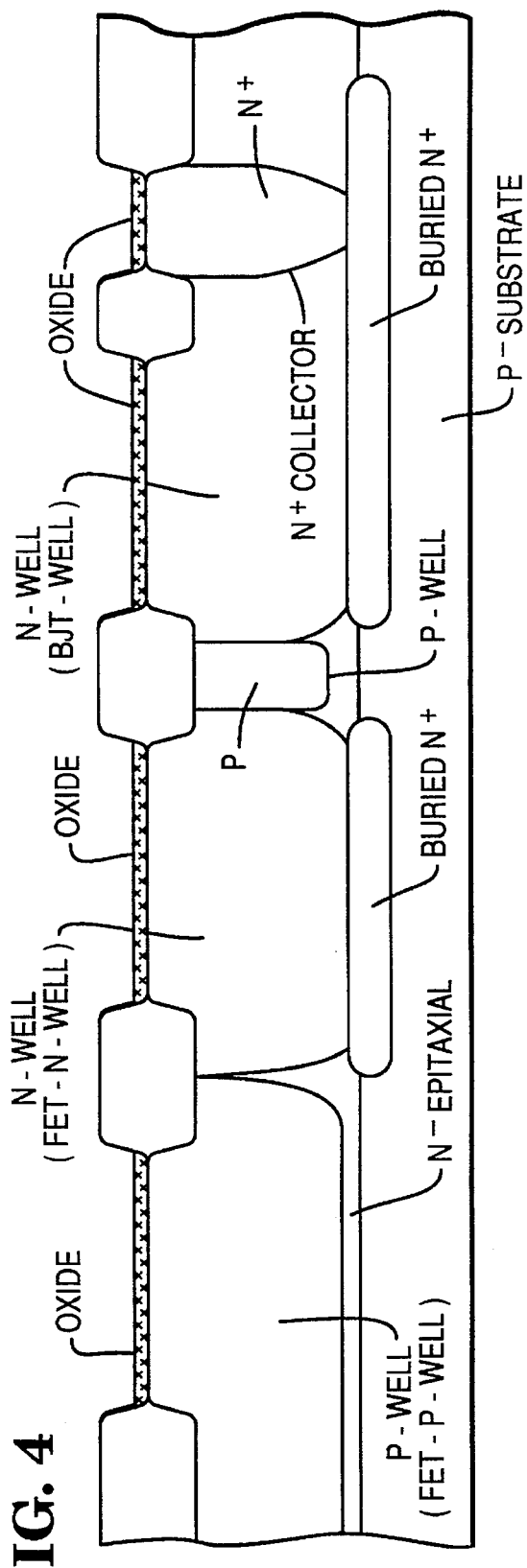

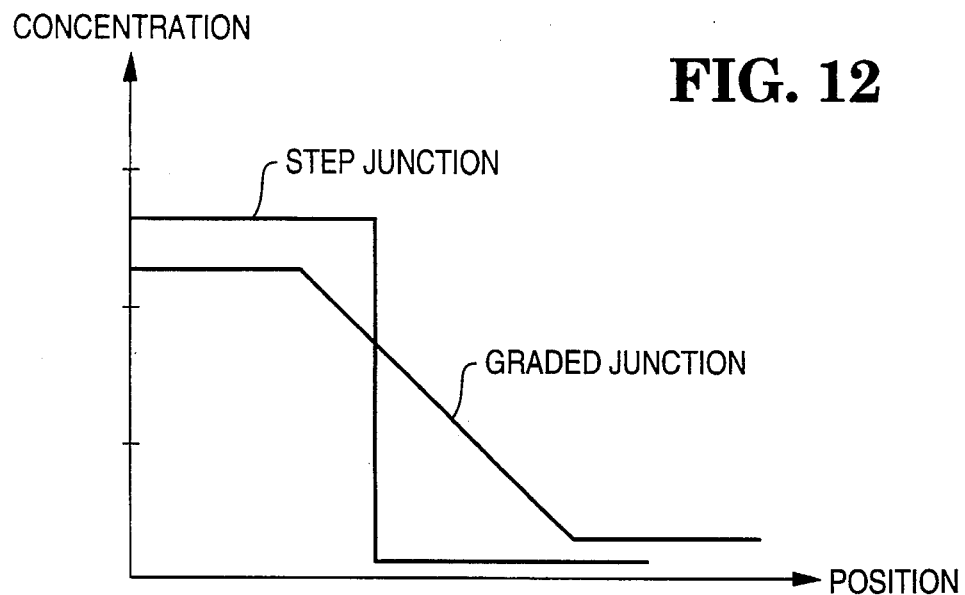
FIG. 12
FIG. 13
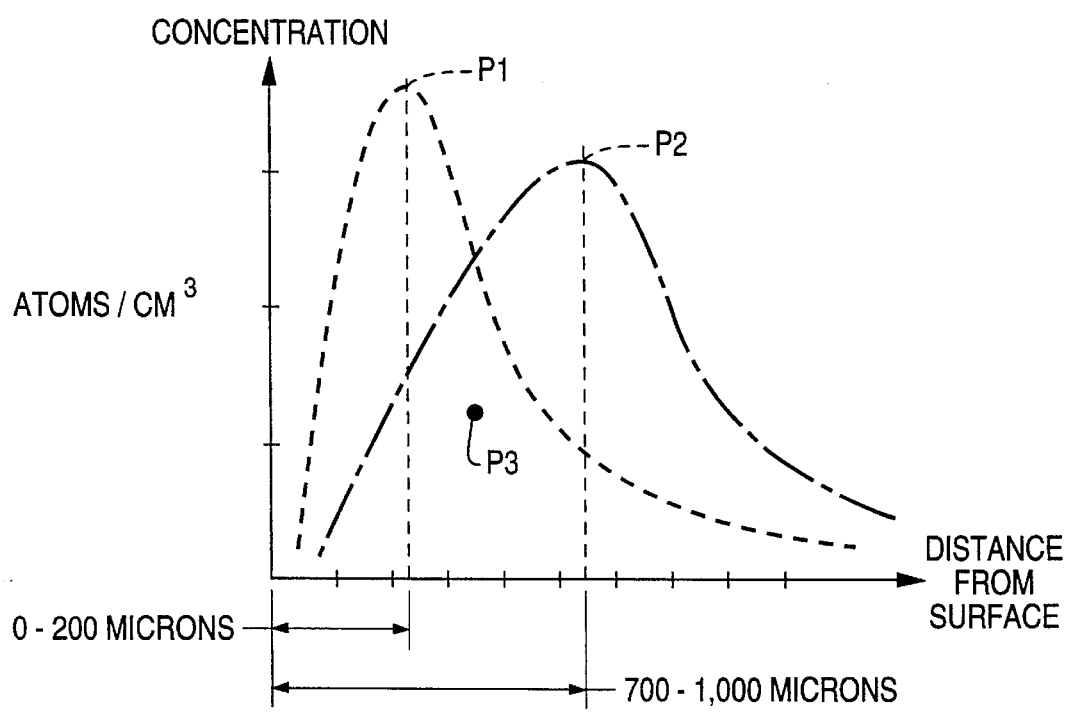

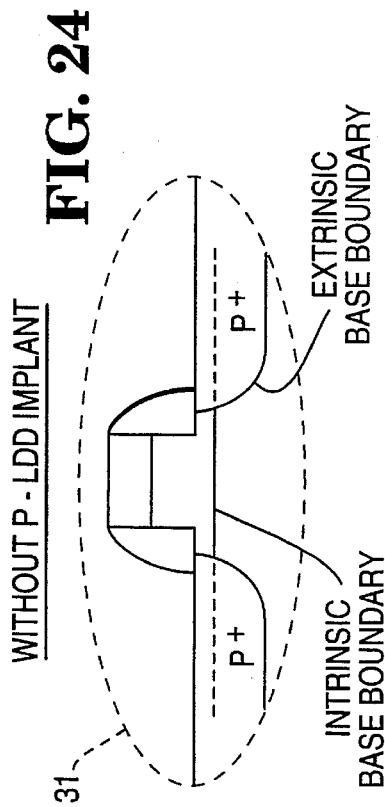
FIG. 23 WITH P - LDD IMPLANT
FIG. 24 WITHOUT P - LDD IMPLANT
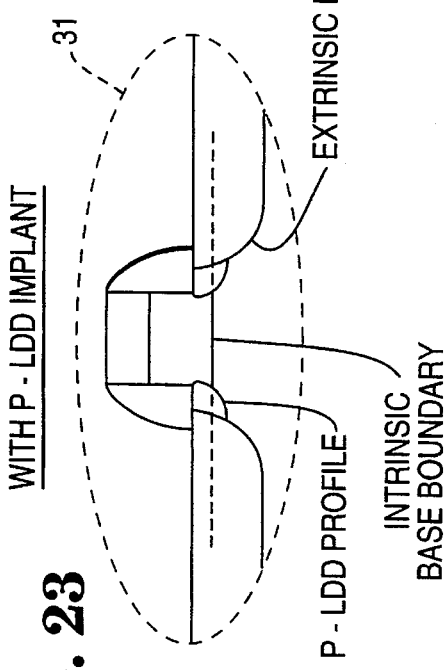
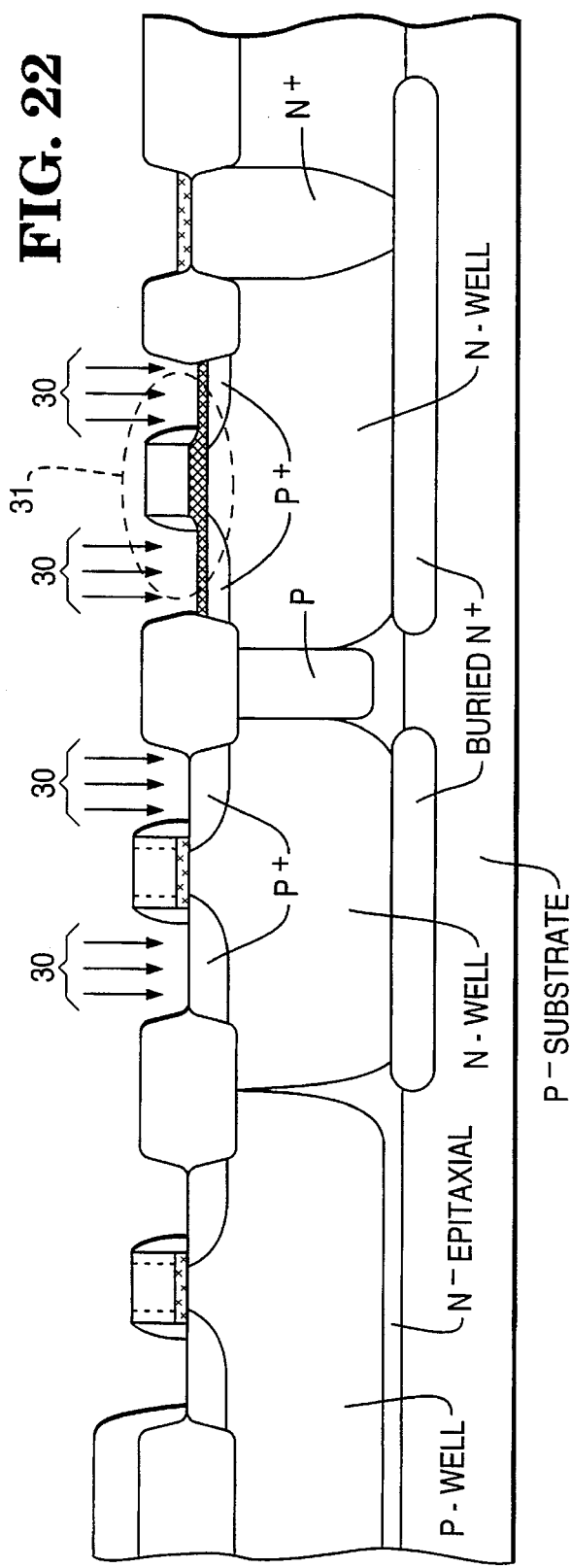
FIG. 22

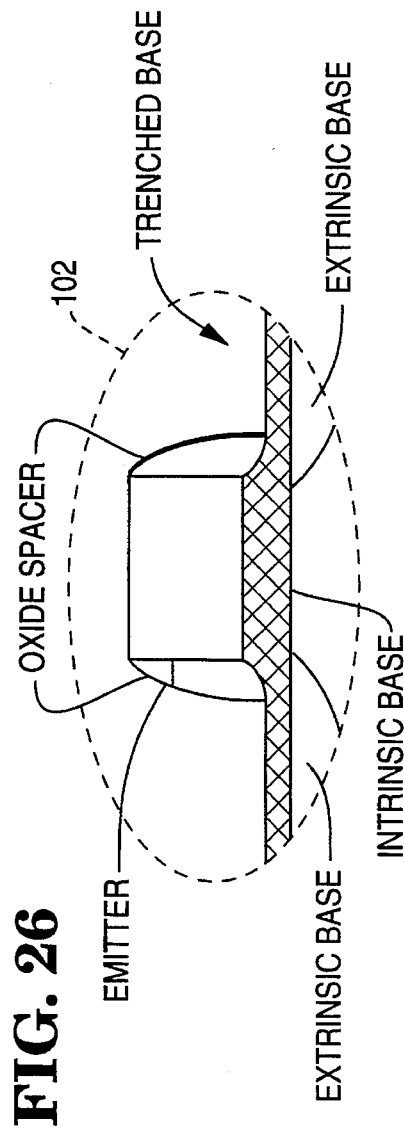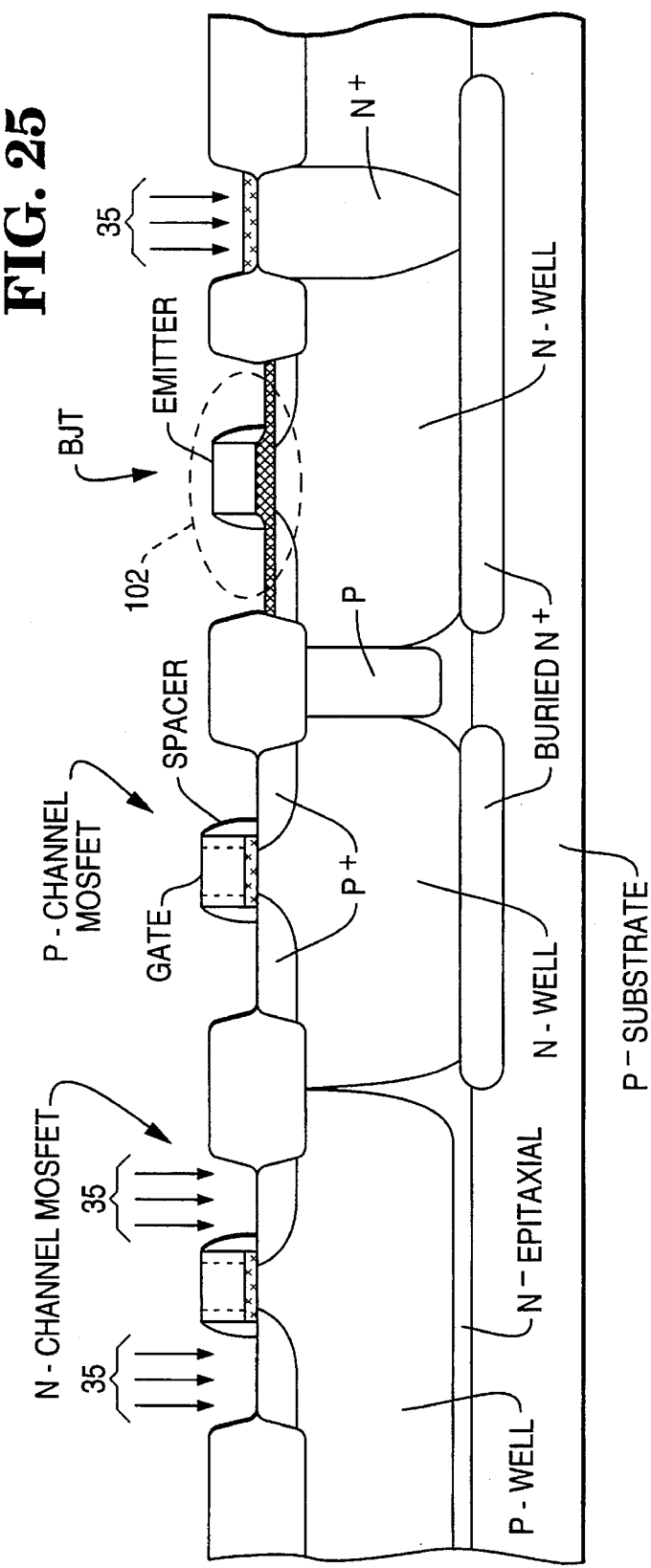
FIG. 26
FIG. 25

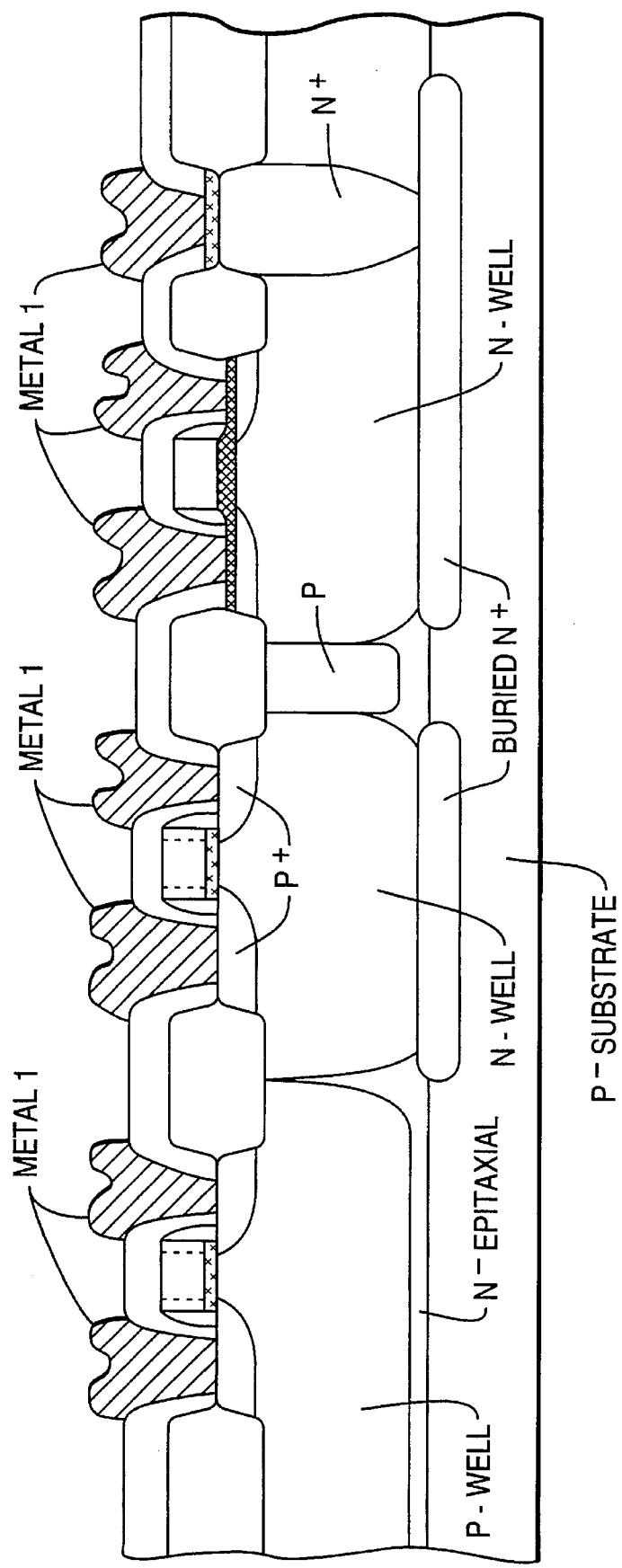

METHOD OF MAKING BI-CMOS INTEGRATED CIRCUIT HAVING A POLYSILICON EMITTER

This is a continuation of application Ser. No. 07/987,916 filed Dec. 7, 1992 now abandoned.

The invention concerns a BI-CMOS process for manufacturing integrated circuits.

BACKGROUND OF THE INVENTION

In general, bipolar junction transistors (BJTs) and field-effect transistors (FETs) are constructed using different sequences of fabrication steps. When both BJTs and FETs are to be fabricated on the same integrated circuit (IC), the fabrication process is generally referred to as BI-CMOS. (The term BI-CMOS is sometimes specifically restricted to a particular combination of BJTs and FETs, namely, BJTs and CMOS-type FETs. CMOS is an acronym for Complementary Metal Oxide Semiconductor).

In theory, the fabrication of BI-CMOS devices is straightforward. However, in practice, if one merely adds a BJT sequence of steps to an FET sequence, the resulting sequence contains a large number of total steps, many of which are redundant.

In IC fabrication generally, it is desirable to reduce the total number of processing steps.

OBJECTS OF THE INVENTION

It is an object of the invention to provide an improved sequence of processing steps for integrated circuits.

It is a further object to provide an improved BI-CMOS processing sequence.

SUMMARY OF THE INVENTION

In one form of the invention, an oxide layer and then a polysilicon film are applied to N-wells and P-wells in a BI-CMOS process. Boron is implanted through the film, into selected N-wells. Then the film and the oxide are removed from the selected wells. Then, in the same sequence of steps, polysilicon gates (for FETs) are formed on the polysilicon film and polysilicon emitters (for BJTs) are formed on the selected wells.

BRIEF DESCRIPTION OF THE DRAWINGS

FIGS. 1–7, 14–17, and 22–28 illustrate a sequence of processing steps which implement one form of the invention.

FIG. 12 illustrates a step junction and a graded junction.

FIG. 13 illustrates a comparison of the graphs of FIGS. 9 and 11.

DETAILED DESCRIPTION OF THE INVENTION

Figure 1:
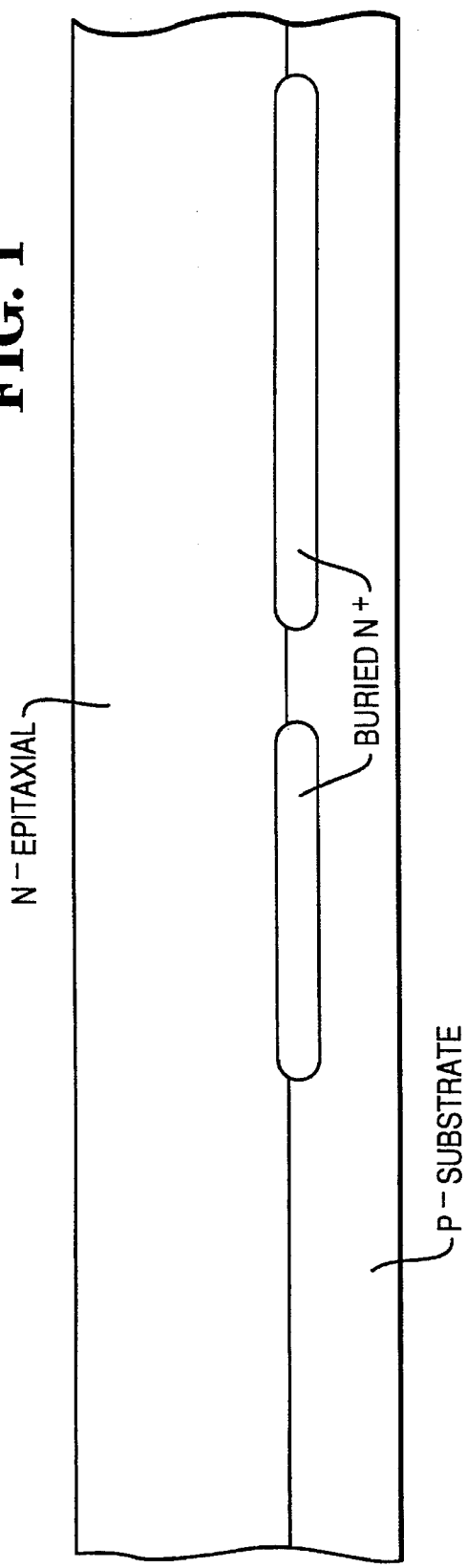
Figure 2:
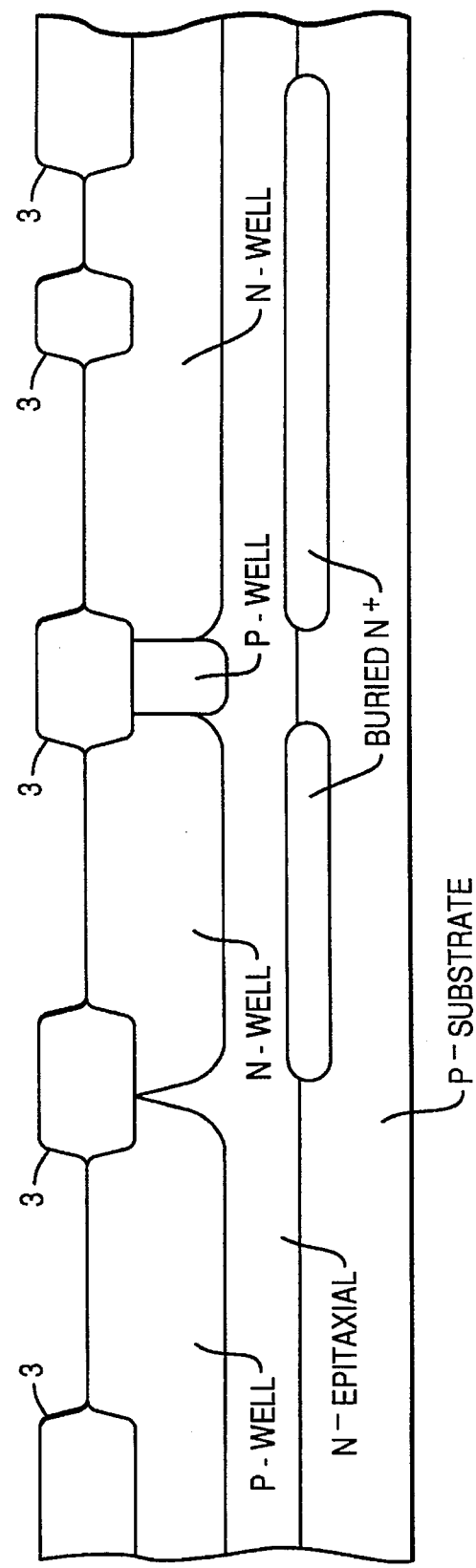

Two buried $N^+$ layers are formed upon a $P^-$ silicon substrate, as shown in FIG. 1. Then, an epitaxial $N^-$ layer is applied, as shown. N-wells and P-wells are formed, as indicated in FIG. 2. Field oxide regions 3 are then grown. Heat treatment drives the two N-wells into contact with the buried layers, as shown in FIG. 3. An implantation creates the $N^+$ structure 6 in FIG. 3, which will eventually form the collector for a BJT. This well is termed a BJT-well. The other wells will later contain FETs, and will be termed FET-wells. The P-well which will later contain an FET will be termed FET-P-well; the N-well which will later contain an FET will be termed FET-N-well, as labeled in FIG. 4.

Figure 5:
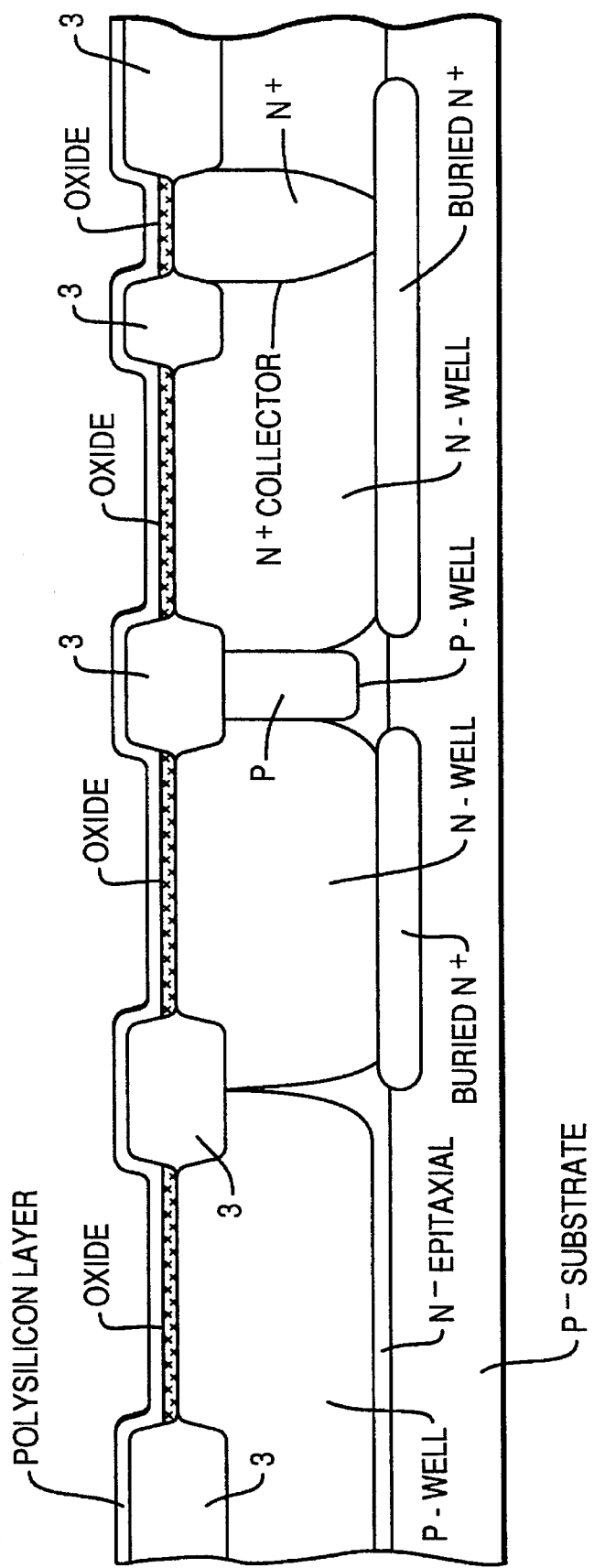
Figure 6:
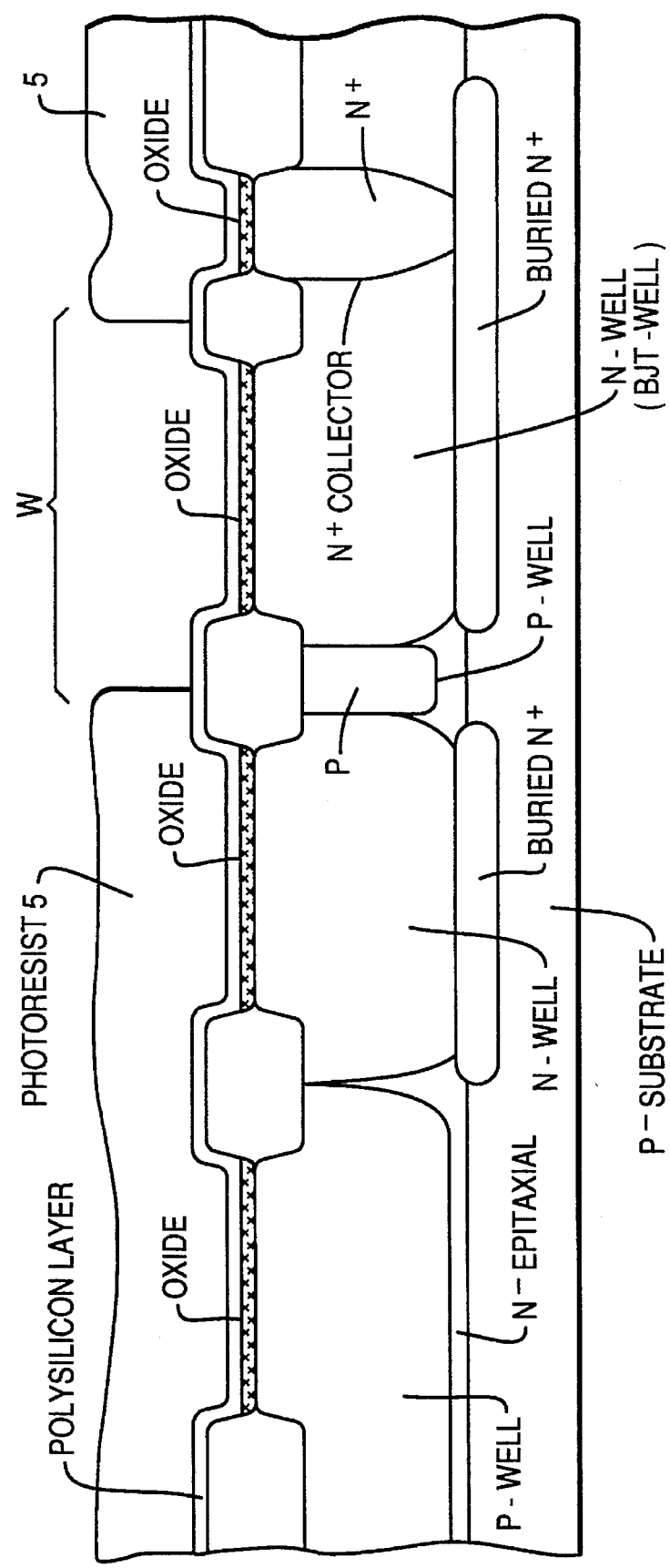

Silicon dioxide (labeled OXIDE in FIG. 4) is grown as indicated. This OXIDE layer is about 50–200 Å (i.e., Angstroms) thick. Then, in FIG. 5, a thin (about 300–1,000 Å) of polysilicon layer is grown over the oxide layers and the field oxide 3. A masking step creates a photoresist mask 5, as indicated in FIG. 6. A window W in the photoresist exposes the polysilicon located atop the BJT well.

Figure 7:
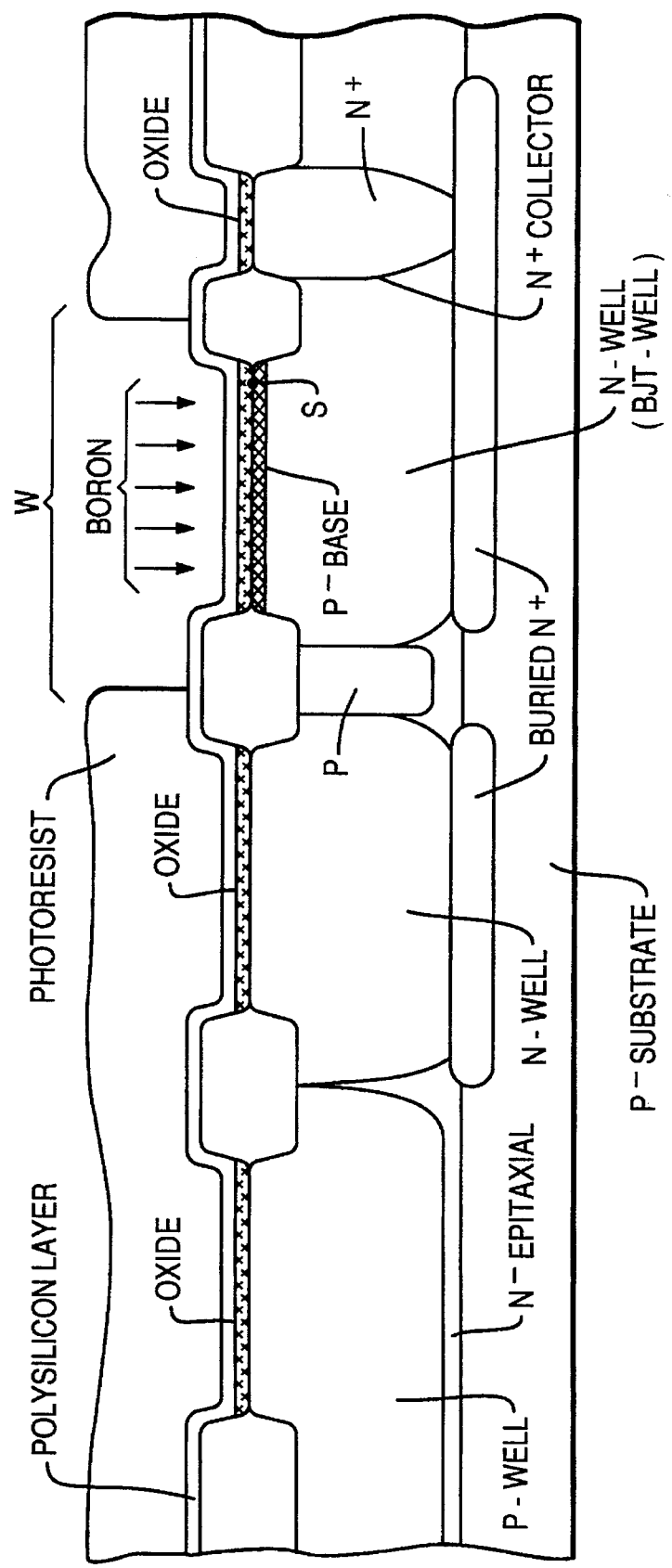

A boron implant is undertaken, as indicated in FIG. 7, creating a $P^-$ base layer, as indicated. The boron is implanted through both the oxide layer and the polysilicon film. The polysilicon film has a scattering effect which reduces the channeling effect which may otherwise occur in the implantation.

Channeling effect refers to the "channels" which crystals present to incoming implant atoms. That is, since crystals are constructed of periodic arrays of atoms, there exist parallel planes of atoms which, combined with other parallel planes, define corridors or "channels" for the incoming atoms to follow.

Figure 8:
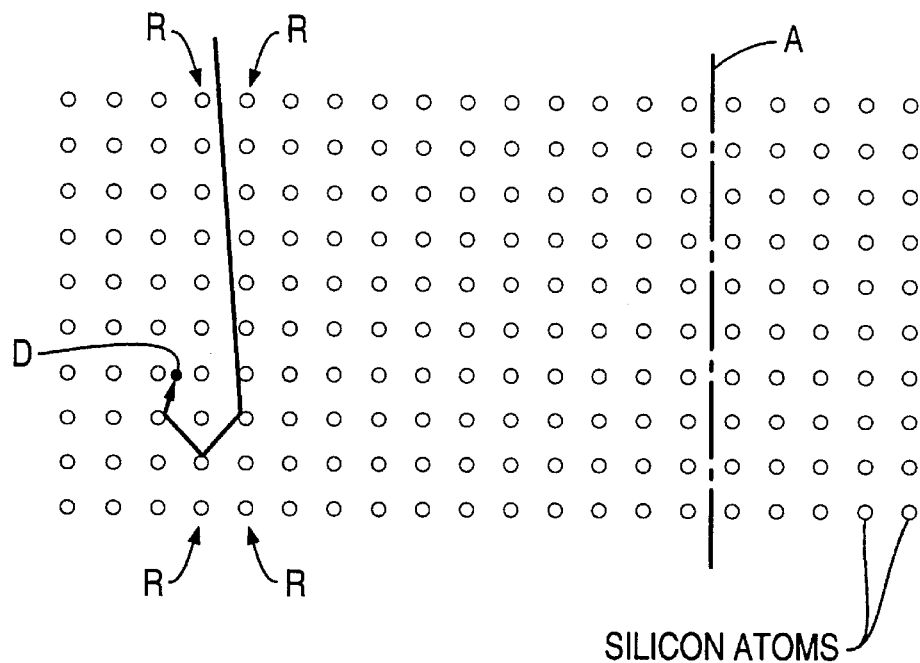
FIGS. 8–11 illustrate channeling and a dopant profile, and how the invention reduces channeling, to improve the profile.
Figure 9:
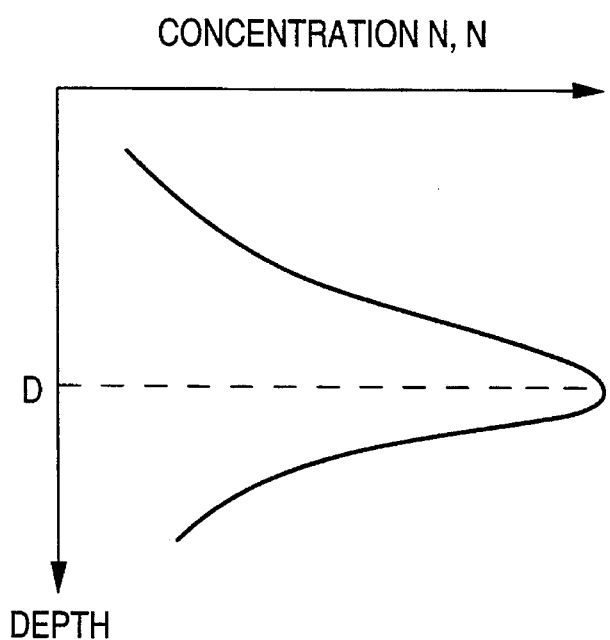

For example, FIGS. 8 and 9 give a rough schematic of a simplified channel. FIG. 8 is a simplified rendition of the atoms in crystalline silicon, such as the silicon forming the BJT-well in FIG. 7. An incoming dopant atom D can follow the path indicated by the arrow, and follows a "channel" defined by the two columns of atoms R.

The channeling allows the dopant atom to reach a deeper position than it would if channeling were absent. The plot at the right of FIG. 9 illustrates an exemplary plot of dopant concentration, N, versus depth.

Figure 10:
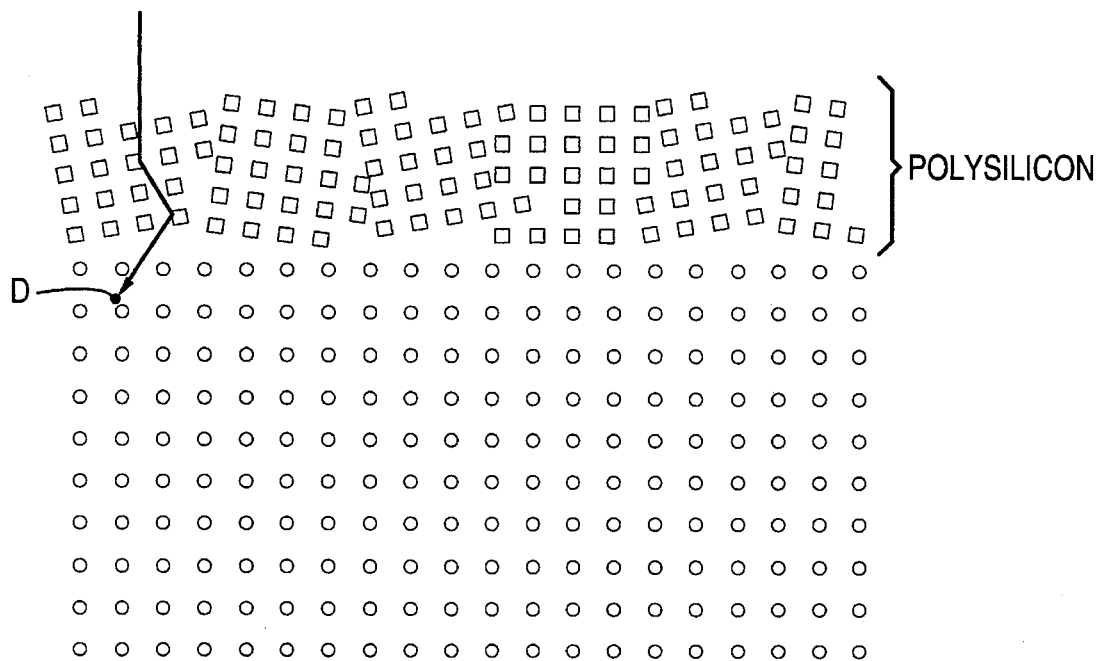

The polysilicon film of FIG. 7 reduces channeling. FIG. 10 illustrates, in rough schematic form, this POLYSILICON film, positioned atop the silicon crystal. The POLYSILICON does not possess the regular crystalline array which the silicon does. Any channels present in the POLYSILICON are short, and randomly oriented. Accordingly, the POLYSILICON blocks the silicon's channels to a large degree. Now, the incoming dopant atom D is scattered by collisions with the POLYSILICON film, and reaches, on average, a lesser depth, as compared with FIG. 8.

Figure 11:
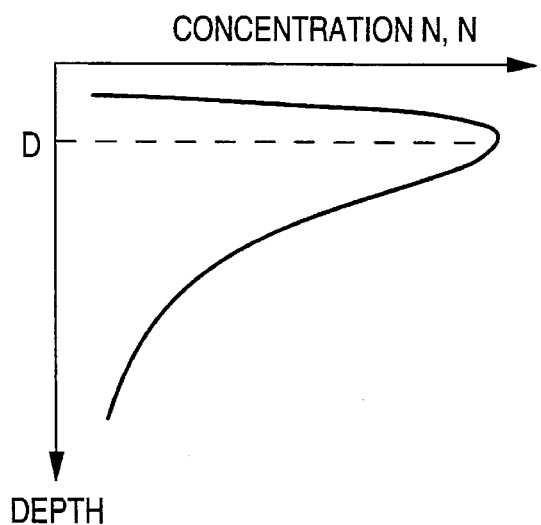

The plot of FIG. 11 illustrates an exemplary plot of dopant concentration, N, versus depth, with the polysilicon layer present. Comparison of the two plots in FIGS. 9 and 11 indicates that the mean penetration depth D is reduced by the polysilicon layer.

The oxide layer is not shown in FIG. 10, because the POLYSILICON is believed to be the major contributor to scattering of the incoming dopants, largely because of its amorphous structure and thickness. The oxide layer has a similar amorphous structure, but a smaller thickness, with consequent reduced scattering.

The POLYSILICON film in FIGS. 10 and 7 can be viewed as a baffle, which inhibits axial entry into a channel. That is, even though the dopant D in FIG. 10 may, in fact, enter a channel, the orientation will probably be wrong for significant channeling to occur. For significant channeling to occur, the dopant atom D must enter parallel, or nearly parallel with the axis A shown in FIG. 8. The POLYSILICON baffles such entry, and induces scattering, causing the atom D to enter off-axis.

The polysilicon scattering layer in FIG. 10 improves breakdown voltage of the P-N junction (i.e., the base-emitter junction) which will later be formed at surface S in FIG. 7. The polysilicon scattering layer causes the dopant concentration to approach a step-junction, rather than a graded junction, as a comparison of the profiles in FIGS. 9 and 11 indicates.

A step junction (or shallow base dopant profile) improves the speed of the transistor. Reliability is improved because the high-field region has been pushed away from the LDD spacer. The region beneath the spacer oxide can contain defects which act as traps for electrons or holes, which degrade the performance of the bipolar transistor.

Many possible combinations of implant conditions are possible. One set of conditions is the following:

boron implant at energies of 30 KeV;

an OXIDE layer in FIG. 7 of thickness 130 Å; and a POLYSILICON film in FIG. 7 of thickness 500 Å.

Under these conditions, a doping profile between the two profiles shown in FIG. 13 can be expected. One meaning of "between" is that the position of the peak (not shown) of the profile lies between the position of P1 and the position of P1. For example, P3 is "between" P1 and P2. Another meaning of "between" is that the rise of the profile is sharper than that of the rise of the profile having P2 as a peak, and that the fall of the profile is steeper than the fall of the profile having P2 as a peak.

Figure 14:
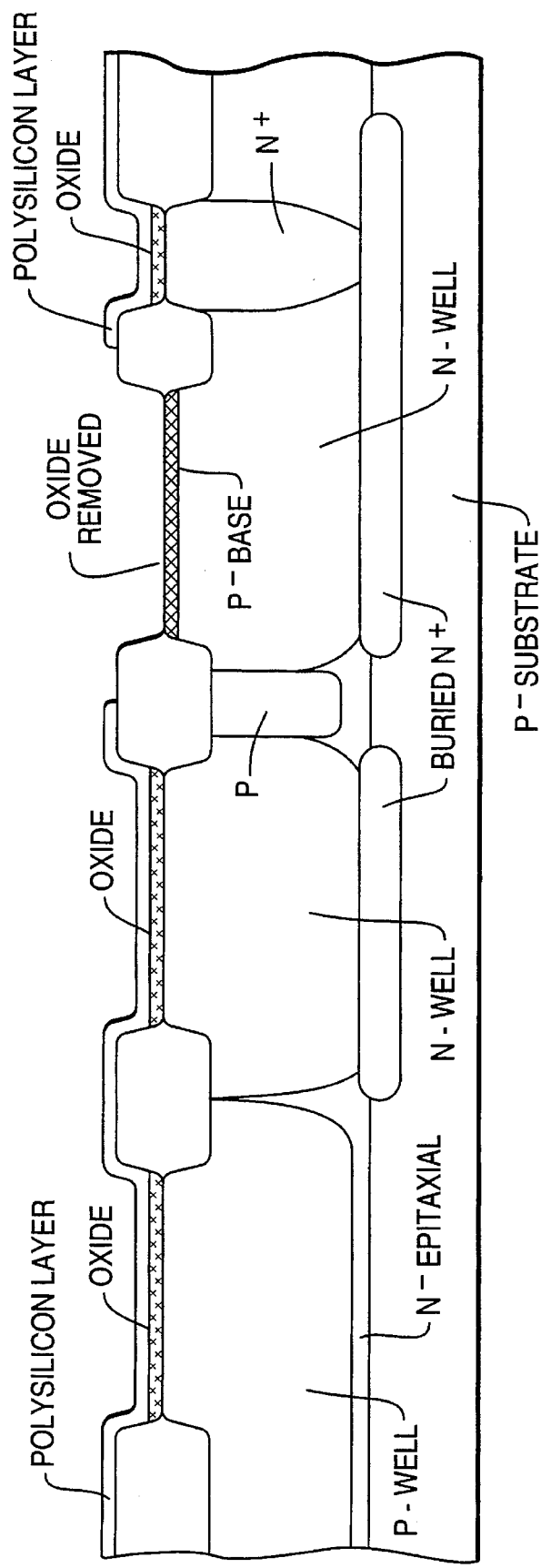

After the scattered-implant, which creates the P⁻ base layer shown in FIG. 7, the oxide coating of the BJT-well is removed, and then the photoresist is removed, producing the structure shown in FIG. 14. However, the oxide layers covering the FET-wells are left intact, and are not removed: they were protected by the thin polysilicon, which protected them from removal while the oxide layer over the BJT-well was being removed. These oxide layers over the FET-wells will form gate oxide for Field Effect Transistors (FETs), in later steps. The photoresist prevented the polysilicon located over the FET-well from being etched away.

Figure 15:
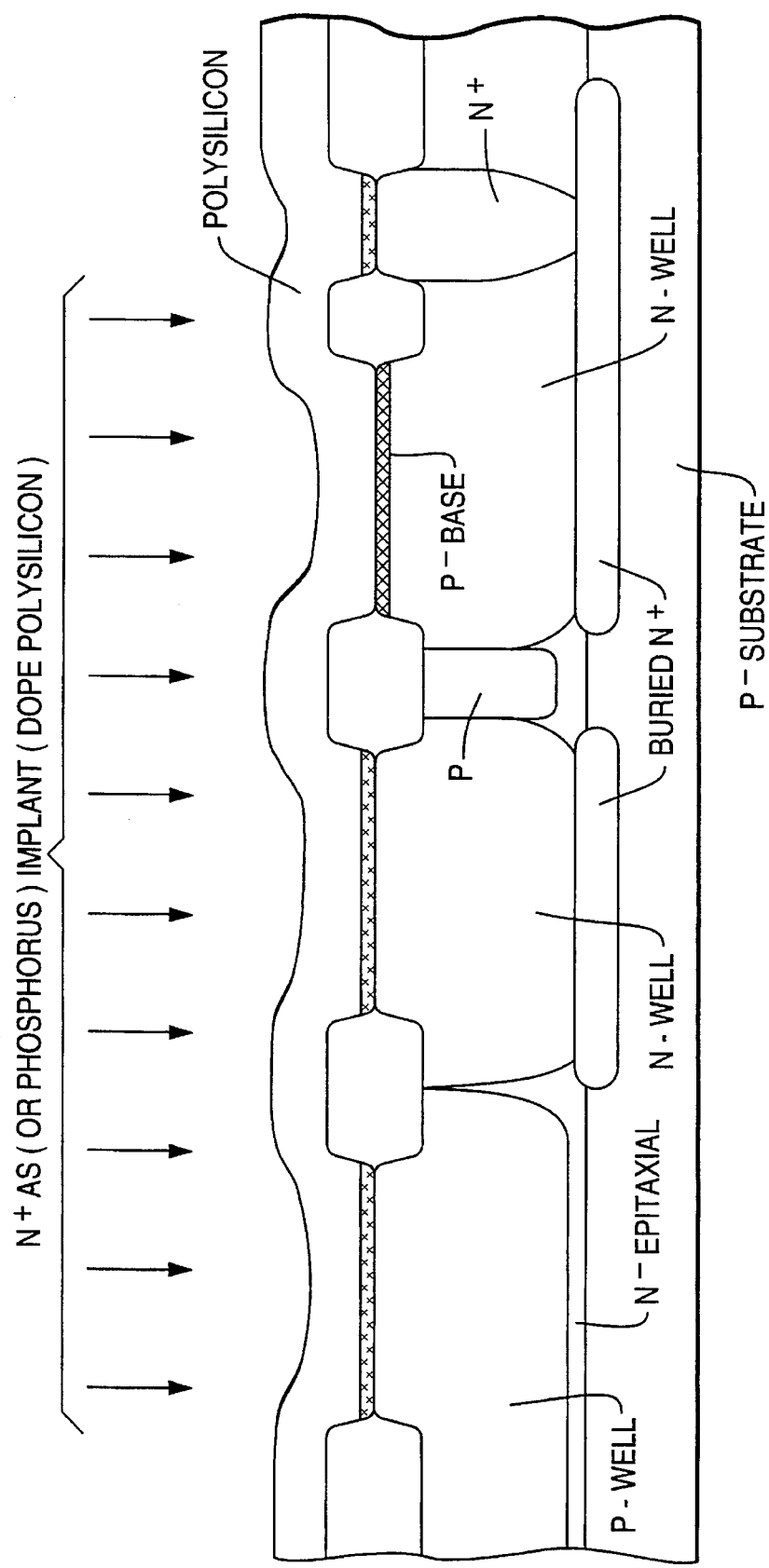

Now, a thick POLYSILICON layer is formed, as shown in FIG. 15. This thick POLYSILICON layer is about 1500–4500 Å thick.

This thick POLYSILICON layer adheres to the POLYSILICON film (over the FET-wells) and to the P⁻ base layer (at the surface of the BJT-well). Next, a mask step is undertaken, in which two types of polysilicon structures, shown in FIG. 16, are created.

One type is labeled POLY GATE. This type forms the gate electrodes for FETs. This type is formed upon the OXIDE layers located on the FET-wells. The other type is labeled POLY EMITTER. The POLY EMITTER forms the emitter structure of the BJT. The POLY EMITTER is formed upon the P⁻ layer.

Figure 17:
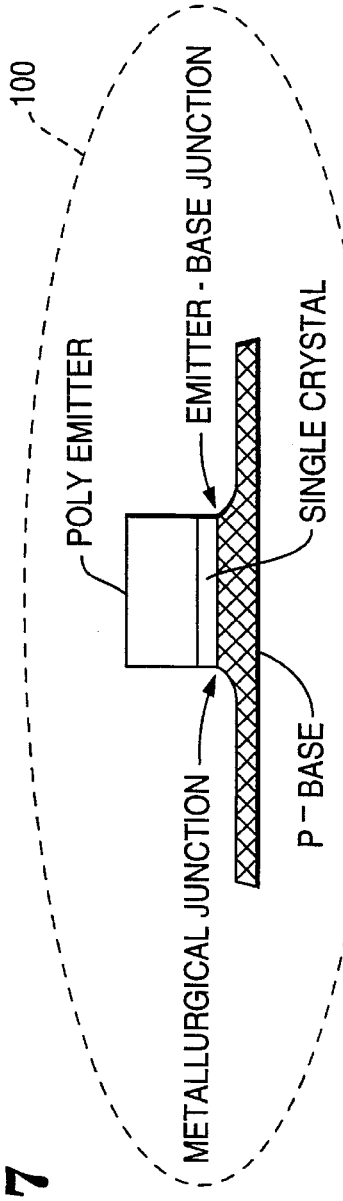
Figure 16:
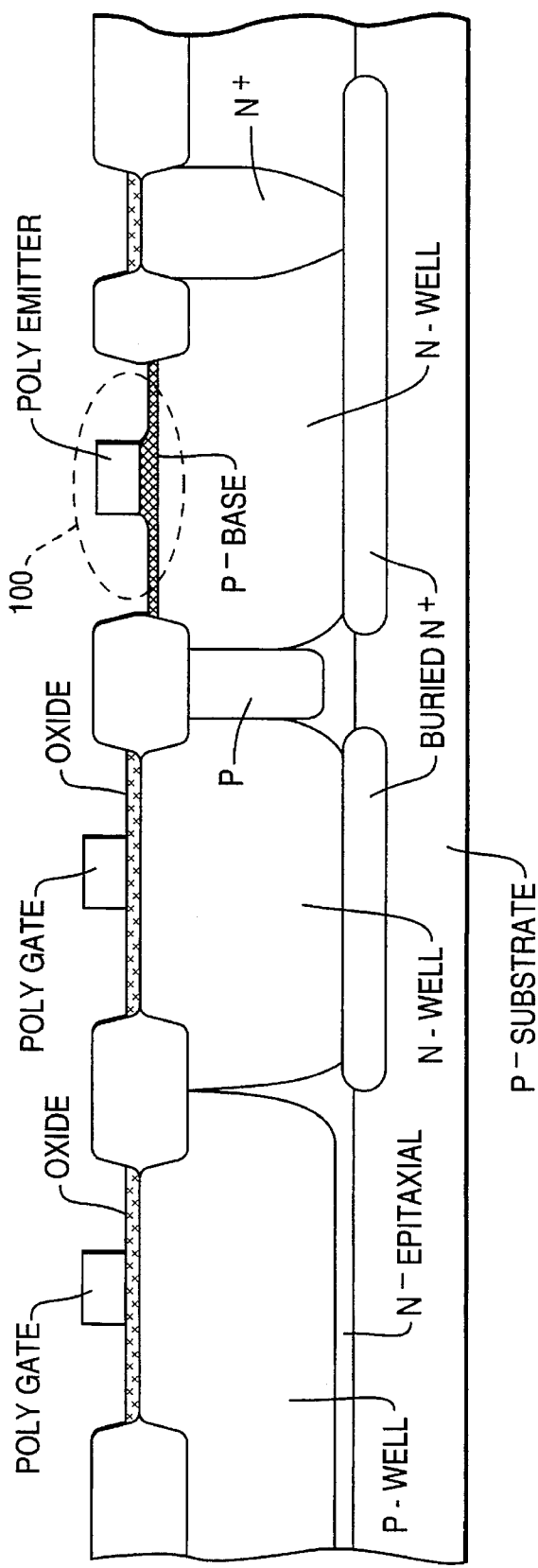

An etching step is undertaken, which produces the shallow trenched base shown in FIG. 16. In this etching step, the POLY EMITTER acts as an etch stop. The base-emitter metallurgical junction is indicated in FIG. 17. This junction area is determined by the cross-sectional area of the POLY EMITTER, which is, in turn, determined by the geometry of the mask (not shown) which created the photoresist structure (not shown) which defined the shape of the POLY EMITTER.

Accordingly, the area of the metallurgical, emitter-base junction in FIG. 17 can be accurately controlled. For example, a base-emitter area of 2.25 square microns can be fabricated, plus-or-minus ten percent.

Accurately controlling the base-emitter area is important, because this area partly determines the Gummel number which, in turn, determines the emitter-to-collector current gain. Controlling the area is important in controlling gain.

Figure 18:
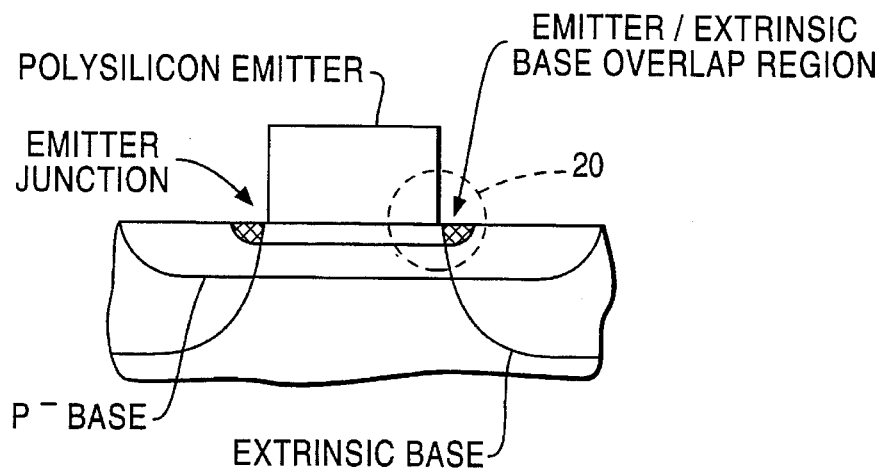
FIG. 18–21 illustrate how a shallow trenched base improves breakdown voltage, and reduces the overlapping between emitter and base.
Figure 19:
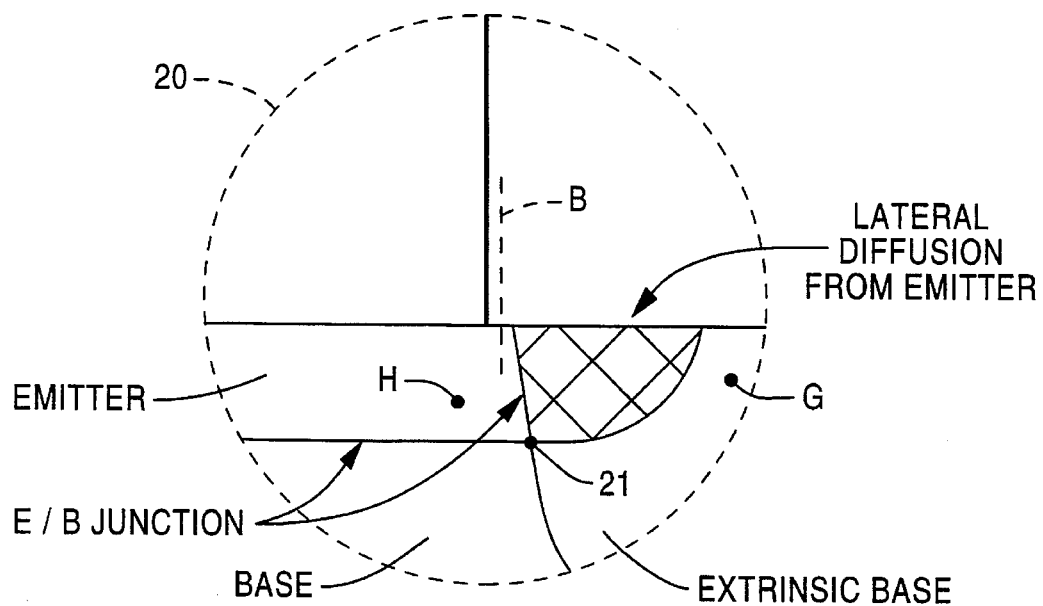
Figure 20:
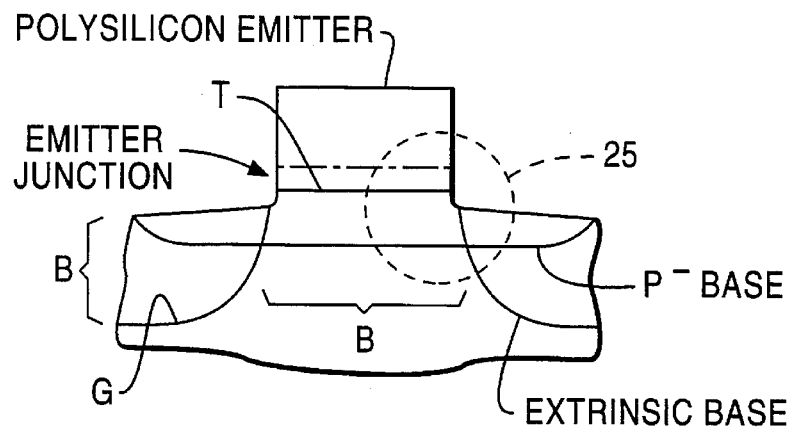

A significant feature of the shallow trenched base is illustrated in FIG. 18 and 20. If no trenched base is created, then the depletion region at the emitter-base junction will look roughly as indicated in the dashed circle 20 in FIG. 19. The curved edge 21 of the depletion region creates a high electric field, which causes a lowered breakdown voltage.

Figure 21:
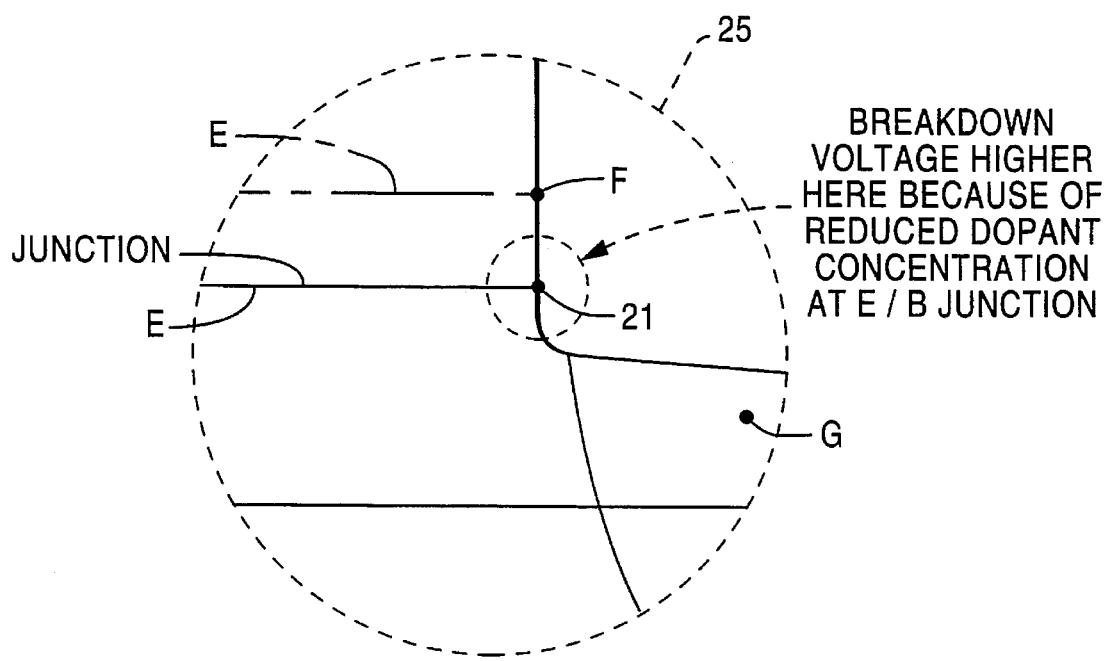

The shallow trench, partially shown in dashed circle 25 in FIG. 21, removes the curved edge 21 of the depletion region in FIG. 19. That is, after the shallow trench has been constructed, the P-type base material located at the fight of imaginary border B in FIG. 19 has been removed. (In FIG. 19, this p-type material still exists.) With the removal of the p-type base material, a depletion region cannot exist to the fight of border B1. Thus, the edges E of the depletion region in FIG. 21 can, in a simplified sense, be viewed as two parallel-plate capacitors. There is little, if any, field enhancement due to a curved or sharp edge such as edge 21 in FIG. 19.

The emitter in FIGS. 16 and 17 can be called butte-mounted, because the eroded part, which form the trench, leave a structure which resembles a butte B in FIG. 21. The butte is located at the intersection of the two bracketed regions B.

After forming the shallow trenched base, an optimal P-type light dose implantation (LDD) may be undertaken to reduce the base resistance (Rb). Afterward, in another processing sequence, an oxide spacer is formed having a width from 500 to 4,000 Angstroms. The regions bordering the spacer oxide are doped P⁺, as indicated by arrows 30 in FIG. 22. These P⁺ ion implantations regions form the extrinsic pan of the base of the NPN bipolar transistor, as labeled in FIGS. 23 and 24. The intrinsic pan of the base is also labeled.

The terms "extrinsic" and "intrinsic," in this context, do not refer to whether a semiconductor is (a) pured and undoped (i.e., "intrinsic") or (b) doped (i.e., "extrinsic"). Rather, the terms in FIGS. 23 and 24 refer to the physical locations of the base regions: The intrinsic base is the "business" part of the base in the transistor, where carrier injection occurs. The extrinsic base is the external part of the base, to which contacts are attached.

This P⁺ ion implantation also forms sources and drains in the FET-N-wells, as indicated by arrows 30 in FIG. 22.

In a second, n-type, light dose implantation, indicated by arrows 35 in FIG. 25 (which may precede the first chronologically), the LDD region of the FET-P-wells is formed. Another heavy dose N+ implant is performed to construct the source and drain of the FET-P-well. Also, in the same N+ implantation, the EMITTER and COLLECTOR of the BJT are made N⁺.

(Appropriate masking steps are taken so that the N⁺ dopants in the source and drain do not diffuse into regions which should be made P⁺ in other source-drain fabrication steps, and vice versa. Masking is not shown.)

Figure 27:
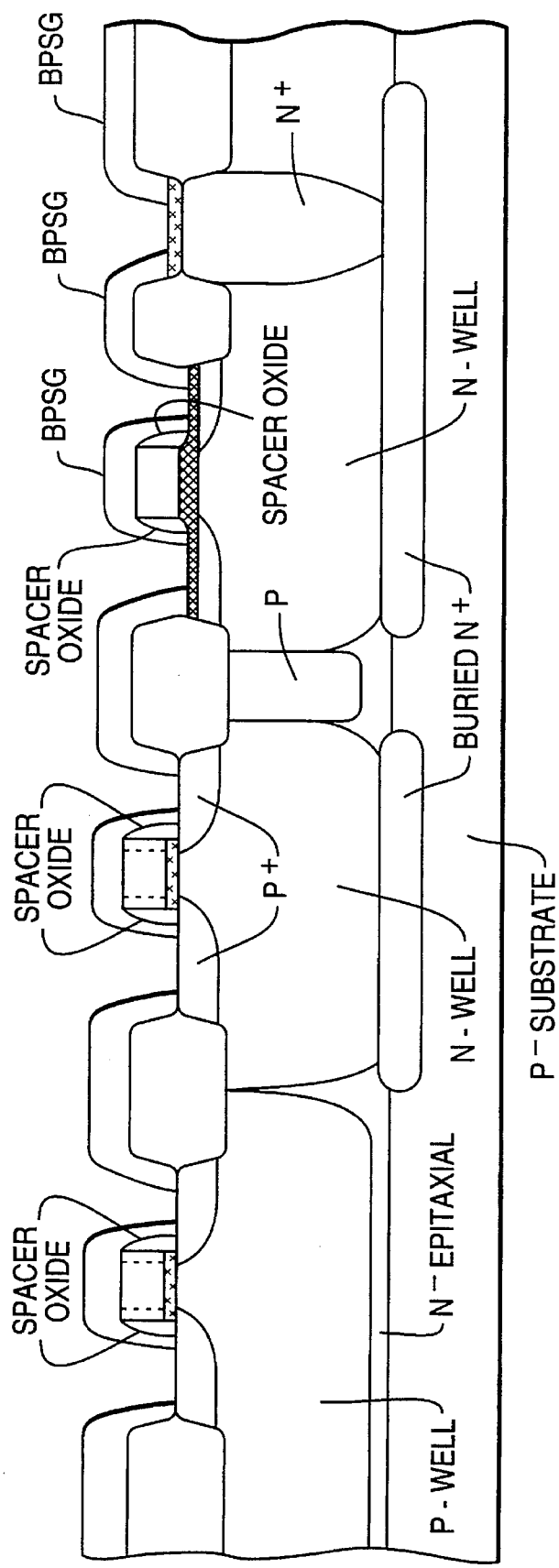

After the source-drain implant, Boro-polysilicate glass is applied, as indicated BPSG in FIG. 27. Then METAL 1 contacts are applied, as indicated in FIG. 28. From the structure shown in FIG. 28, known steps, such as forming vias, additional metallization, and passivation, are undertaken, to produce the finished integrated circuit.

Numerous substitutions and modifications can be undertaken without departing from the true spirit and scope of the invention. What is desired to be secured by Letters Patent is the Invention as defined in the following claims.

I claim:

1. A method of forming a PN junction in a BJT, comprising the following steps:
   a) forming a layer of silicon dioxide on a substrate;
   b) forming a layer of polysilicon, in the range of 300 to 1,000 Angstroms thick, on the silicon dioxide layer;
   c) implanting a P-type dopant through both said layers and into the substrate to create a base region having a shallow base dopant profile;
   d) removing said layers; and
   e) forming an N-type polysilicon emitter on said substrate.

2. In the fabrication of an integrated circuit, the improvement comprising:
   a) forming a first N-well;
   b) forming a P-well, adjacent the first N-well;
   c) forming a second N-well, adjacent the P-well;
   d) in one step, forming a gate oxide on the second N-well, and a layer of oxide on the first N-well;
   e) forming a layer of polysilicon over the gate oxide and the layer of oxide; and
   f) implanting a dopant into the first N-well, by driving the dopant through both the the layer of oxide and the layer of polysilicon to create a base region having a shallow base dopant profile.

3. In the manufacture of a BI-CMOS integrated circuit, the improvement comprising:
   a) applying a polysilicon layer over an oxide-coated epitaxial layer;
   b) using part of the polysilicon film as a baffle during an implant of dopants, to reduce channeling and create a base region having a shallow base dopant profile;
   c) removing
      i) said part of the polysilicon film, and
      ii) the oxide beneath said part;
   d) applying a second polysilicon layer; and
   e) forming both (i) gates for FETs and (ii) emitters for BJTs from the second polysilicon layer.

4. In the manufacture of a BI-CMOS integrated circuit, the improvement comprising:
   a) applying a polysilicon layer over an oxide-coated epitaxial layer;
   b) using the polysilicon layer as a baffle during an implant of dopants, to reduce channeling by the dopants; and
   c) forming gates for FETs from parts of the polysilicon not used for baffling.

5. A process for fabricating BI-CMOS integrated circuits, comprising the following steps:
   a) forming a plurality of $N^+$ buried layers between $N^-$ epitaxial silicon layer and a $P^-$ substrate;
   b) forming P-wells and N-wells in the epitaxial silicon layer, such that the N-wells extend to the buried layers;
   c) forming isolation oxide islands on the epitaxial silicon layer, to isolate selected wells;
   d) forming a layer of oxide on the P-wells and the N-wells;
   e) applying a film of polysilicon over the layer of oxide;
   f) creating windows in hardened photoresist over selected N-wells, termed BJT-wells;
   g) implanting boron
      i) through the windows, thence
      ii) through the film of polysilicon, thence
      iii) through the oxide layer, and thence
      iv) into BJT-wells, to thereby form a $p^-$ region at the surface of the BJT-wells;
   h) removing the film of polysilicon and the layer of oxide located in the window;
   i) removing the photoresist;
   j) forming a polysilicon layer over at least the $P^-$ region;
   k) forming a polysilicon gate on the oxide layer remaining on at least one of said FET-wells and, simultaneously, forming a polysilicon emitter on at least one of said BJT-wells;
   l) removing portions of said $P^-$ regions, at the base of said at least one polysilicon emitter; and
   m) implanting N-type dopants into the $P^-$ regions surrounding said at least one polysilicon emitter and simultaneously into the regions surrounding said at least one polysilicon gate.

6. A method of fabricating an intermediate structure from which a BI-CMOS integrated circuit can be constructed, comprising the following steps:
   a) in an epitaxial layer, forming doped wells,
      i) some of which have exposed doped layers at their surfaces; and
      ii) others of which carry an oxide layer coated by a polysilicon film;
   b) implanting a P-type dopant through the oxide layer and polysilicon film to create a base region having a shallow base dopant profile;
   c) forming
      i) polysilicon gates on said polysilicon film and, simultaneously,
      ii) polysilicon emitters upon the exposed doped layers.

7. The process according to claim 5 wherein said step k) further comprises:
   a) forming a layer of polysilicon on said BJT-wells and over said oxide layers remaining on said FET-wells;
   b) applying a photoresist mask over said layer of polysilicon; and
   c) forming said polysilicon gates and polysilicon emitters from said polysilicon layer.

8. A process for fabricating BI-CMOS integrated circuits, comprising the following steps:
   a) forming a plurality of $N^+$ buried layers between an $N^{31}$ epitaxial silicon layer and a $P^-$ substrate;
   b) forming P-wells and N-wells in the epitaxial silicon layer, such that the N-wells extend to the buried layers;
   c) forming isolation oxide islands on the epitaxial silicon layer, to isolate selected wells;
   d) forming a layer of oxide on the P-wells and the N-wells;
   e) applying a film of polysilicon over the layer of oxide;
   f) creating windows in hardened photoresist over selected N-wells, termed BJT-wells;
   g) implanting boron through the windows, through the film of polysilicon, through the oxide layer, and into BJT-wells, to thereby form $P^-$ regions at the surfaces of the BJT-wells;

h) removing the film of polysilicon and the layer of oxide located in the windows;

i) removing the photoresist;

j) removing polysilicon film exposed by removing the photoresist;

k) forming polysilicon gates on the oxide layers remaining on said FET-wells and, simultaneously, forming polysilicon emitters on the BJT-wells;

l) removing portions of said $P^-$ regions around the bases of said polysilicon emitters; and m) implanting N-type dopants into the $P^-$ regions around the polysilicon emitters and simultaneously into the $P^-$ regions around said polysilicon gates.

* * * * *

UNITED STATES PATENT AND TRADEMARK OFFICE
CERTIFICATE OF CORRECTION

PATENT NO. : 5,516,718
DATED : May 22, 1996
INVENTOR(S) : Steven S. Lee

It is certified that error appears in the above-indentified patent and that said Letters Patent is hereby corrected as shown below:

Column 6, line 50, delete "$N^{31}$" and insert --$N^-$--.

Signed and Sealed this

Twentieth Day of August, 1996

Attest:

BRUCE LEHMAN

*Attesting Officer*   *Commissioner of Patents and Trademarks*